United States Patent
Wai et al.

(10) Patent No.: US 7,183,842 B1
(45) Date of Patent: Feb. 27, 2007

(54) OPTIMUM COMPOSITE CASCODE AMPLIFIER

(76) Inventors: Yu Hei Sunny Wai, 2282 Hastings Dr., Belmont, CA (US) 94002; Arnold M. Lazarus, 61 Colton Ave., Sayville, NY (US) 11782

(*) Notice: Subject to any disclaimer, the term of this patent is extended or adjusted under 35 U.S.C. 154(b) by 110 days.

(21) Appl. No.: 11/137,102

(22) Filed: May 26, 2005

(51) Int. Cl.
*H03F 1/24* (2006.01)

(52) U.S. Cl. .......................................... 330/98; 330/85
(58) Field of Classification Search ................. 330/98, 330/99, 85, 295, 310, 311
See application file for complete search history.

(56) References Cited

U.S. PATENT DOCUMENTS

| | | | | |
|---|---|---|---|---|
| 4,074,204 A | * | 2/1978 | Broburg et al. | 330/109 |
| 4,577,160 A | | 3/1986 | Lettvin et al. | 330/149 |
| 5,257,285 A | | 10/1993 | Thorp | 375/229 |
| 5,365,189 A | | 11/1994 | Coulson | 330/126 |
| 5,854,573 A | | 12/1998 | Chan | 330/292 |
| 6,275,102 B1 | * | 8/2001 | Muza | 330/85 |
| 6,590,452 B1 | | 7/2003 | van Rhijn | 330/253 |
| 7,078,965 B2 | * | 7/2006 | Laletin | 330/48 |

* cited by examiner

*Primary Examiner*—Henry Choe (57) ABSTRACT

An improved amplifier circuit which effectively combines two amplifier stages by utilizing two nested feedback loops so that an inverting amplifier topology is used with a FET input device, operating as a common source/emitter configuration cascoded by the inverting input of an opamp. The circuit operates as a non-inverting amplifier and is connnected to the drain or collector with local nested feedback to (a) independently control the loop gain, (b) linearize its own operation, and (c) control the stability of the circuit. Additional inputs can be summed using a non-inverting summing circuit. One application reduces distortion derived from a high impedance, capacitive input source.

37 Claims, 4 Drawing Sheets

OPTIMUM COMPOSITE CASCODE AMPLIFIER

FIELD OF INVENTION

The present invention relates generally to multi-stage, low power, low noise, battery operated amplifiers that are optimized for use with high dynamic range, high impedance, low capacitive input sources.

CROSS-REFERENCES

None

STATEMENT REGARDING THE USE OF FEDERAL FUNDS

No federal funding, direct or indirect, has been utilized in conjunction with the development of the present invention.

STATEMENT REGARDING MICROFICHE RECORDS

No microfiche records are used in the application submitted for the present invention.

PUBLICATION

The invention disclosed in this application has not and will not be the subject of an application filed in another country or under a multilateral agreement that requires publication at eighteen months after filing. Pursuant to 35 U.S.C. 122(b), this application is not to be published other than in the United States.

PRIOR ART

No prior art can be found which discloses the present invention. No patents, no publications and no known application disclose the method or apparatus of the present invention. However, given the fact that the components which are or which may be utilized in implementing the present invention are commonly used in operational amplifier circuits and given the fact that the objectives of the present invention are similar to those of existing operational amplifier applications, the references given below are cited so as to elaborate upon the unexpectedly superior performance realized by the present invention when compared with existing technologies.

Referring to U.S. Pat. No. 6,590,452 by van Rhijn which discloses a gain boost circuit arrangement in a folded cascode type of operational amplifier whose object is to improve the overall DC gain of the operational amplifier while maintaining good low noise performance. Unlike the present invention which is concerned with AC gain, stability and performance, the van Rhihn arrangement involves enhancement of the overall DC gain of the operational amplifier.

Referring to U.S. Pat. No. 5,854,573 by Chan which discloses a low-voltage multipath-miller-zero-compensated operational amplifier which includes a class AB front stage and a class AB back stage. The Chan arrangement discloses a capacitor coupling a feedback loop between the output and the inverted input of the back stage as in the present invention. The Chan arrangement however, among other considerations, does not utilize a second feedback loop in the manner of the present invention and thus does not provide the unexpectedly new and very favorable performance characteristics of the present invention.

Referring to U.S. Pat. No. 5,365,189 by Coulson which discloses a two stage composite amplifier utilizing a single feedback circuit. The Coulson circuit does not realize the functionality of the present invention as it uses two distinct stages rather than the arrangement of the present invention which derives its characteristics from the stability and continuity realized by utilizing two nested feedback loops combined in a single stage.

Referring to U.S. Pat. No. 5,257,285 by Thorp which discloses a transimpedance pre-amplifier arranged to have a complex pole response resulting from the integration of the open-loop pole with the pole associated with a circuit feedback. Again, the arrangement relies upon distinct stages of amplification to realize an enhanced performance rather than utilizing two nested feedback loops combined in a single stage as is found in the present invention.

Referring to U.S. Pat. No. 4,577,160 Lettvin, et al which discloses multi-stage high gain operational amplifier arrangements which lack the nested feedback loops of the present invention and which therefore do not exhibit the favorable characteristics of the present invention.

The referenced patents, all of which are typical of the patents found in the field of operational amplifier circuits and in commercial operational amplifier circuit design, fail to realize or to teach the advantages of the present invention.

SUMMARY OF THE INVENTION

The present invention is an apparatus and method for providing an improved amplifier. The amplifier is a non-inverting amplifier topology. The input device is a field effect transistor (FET) or a bipolar junction transistor (BJT) and operates as a common source or emitter with the configuration cascoded by the inverting input of an opamp.

It is an object of the present invention to provide an improved amplifier which produces an output signal with reduced distortion derived from an input signal from a high impedance, capacitive input source.

It is another object of the present invention to provide an amplifier which exhibits low distortion and low noise.

It is yet another object of the present invention to provide an amplifier which exhibits high gain and which has low noise, low distortion and low power drain.

It is yet another object of the present invention to provide a non-inverting summing amplifier.

These and other objects an advantages of the present invention will become clear to those skilled in the art in view of the description of the best presently known mode of carrying out the intention and the applicability of the preferred embodiment as described here in and as illustrated in the several figures of the drawings.

SPECIFICATION

The best known implementation of the present invention are the composite cascode amplifiers described hereinbelow.

The present invention exhibits certain characteristics which can be termed ideal as it resolves many of the problems which have long persisted in the design of battery powered high dynamic range, high input impedance linear amplifiers. Every element to be found in this optimized design can be found in other amplifier designs, most of which have been in use for long periods of time and all of which are to be found in textbook references. This specific combination however demonstrates remarkable simultaneous advantages in multiple areas which heretofore have not been realized by any amplifier circuit. Thus, it is a new configuration of old technologies which has given this unexpected result. In spite of the extensive literature in this field and the broad application base which exists for low power amplifiers, this very simple design is indeed original and demonstrates very beneficial characteristics which have not been evident in prior applications or publications.

An ideal amplifier has no drift, no voltage offset, no noise, zero settling time and infinite bandwidth. By comparison, many low power amplifier can have low drift and offset voltage, but very poor noise characteristics, low bandwidth or high distortion. An amplifier made from discrete components can have low noise and excellent bandwidth but also usually has poor voltage offset and drift while being complicated and expensive to make. Also they normally require high operating currents or have output voltage or current limitations.

A composite amplifier combines the best traits of the operational amplifier and the discrete, while suppressing the worst traits of both. However, until now there has not been provided a composite amplifier that achieves all of the desirable traits of an ideal battery powered amplifier.

An amplifying system usually consists of several stages in cascade. The front-end stages in the amplification chain operate in a small-signal environment, and so signal quality is easily maintained because the active devices operate well within their linear regions. The output stage, however commonly delivers a larger current or voltage to a load. In the case of audio amplifiers, there is the additional constraint of maintaining high linearity in the final output signal.

In the case of battery powered linear amplifiers, device bias currents are the dominate factors in preserving battery life. The general rule in designing amplifying circuits is that tradeoffs of one or more desirable features for other less desirable features is almost always required. In a given situation, certain considerations such as, for example, maximizing bandwidth, may be one of the important factors and, as such, it dominates the design to the detriment of other factors such as power consumption and noise levels.

The present invention is remarkable in that it involves substantially no major tradeoffs or compromises and easily out performs current designs in one more areas. Although the circuit is particularly suited to a specialized range of applications, for these applications, it provides superior characteristics over any existing design approach or any currently used amplifier circuit. Further, the design is deceptively simple and is low in cost to fabricate.

The present invention involves an amplifying circuit which may be cascaded and which (1) has low power requirements, (2) exhibits low distortion and low noise characteristics, and (3) has high input impedance and low output impedance. By low power requirements, is meant, for example, a battery operated amplifier circuit drawing one milliamp which would equate to 600 hours of operation using an alkaline 9 volt battery. By low distortion is meant a circuit which compensates for normal nonlinear operating characteristics. By low noise characteristics is meant, that the noise levels achievable derive solely from the inherent noise source characteristics of the components themselves. One specific application for the present invention is its use as a first stage amplifier for a capacitive transducer or sensor as may be utilized in a guitar transducer or for other musical instruments. Another application is as the first stage of an accelerometer for high dynamic range automotive or industrial measurements. This cascode amplifier can easily function for over 1000 hours of battery life, for a standard 9 volt battery, over a dynamic range greater than 100 dB and have less than 0.03 percent THD with standard off-the-shelf components costing less than $2.00 (USD).

To understand the range of applications and the details of implementing the present a invention, reference is made to the drawings. Referring particularly to the figures wherein like-referenced numbers have been applied to like-parts throughout the description as illustrated in the several figures of the drawings.

Figures 1A, 1B:
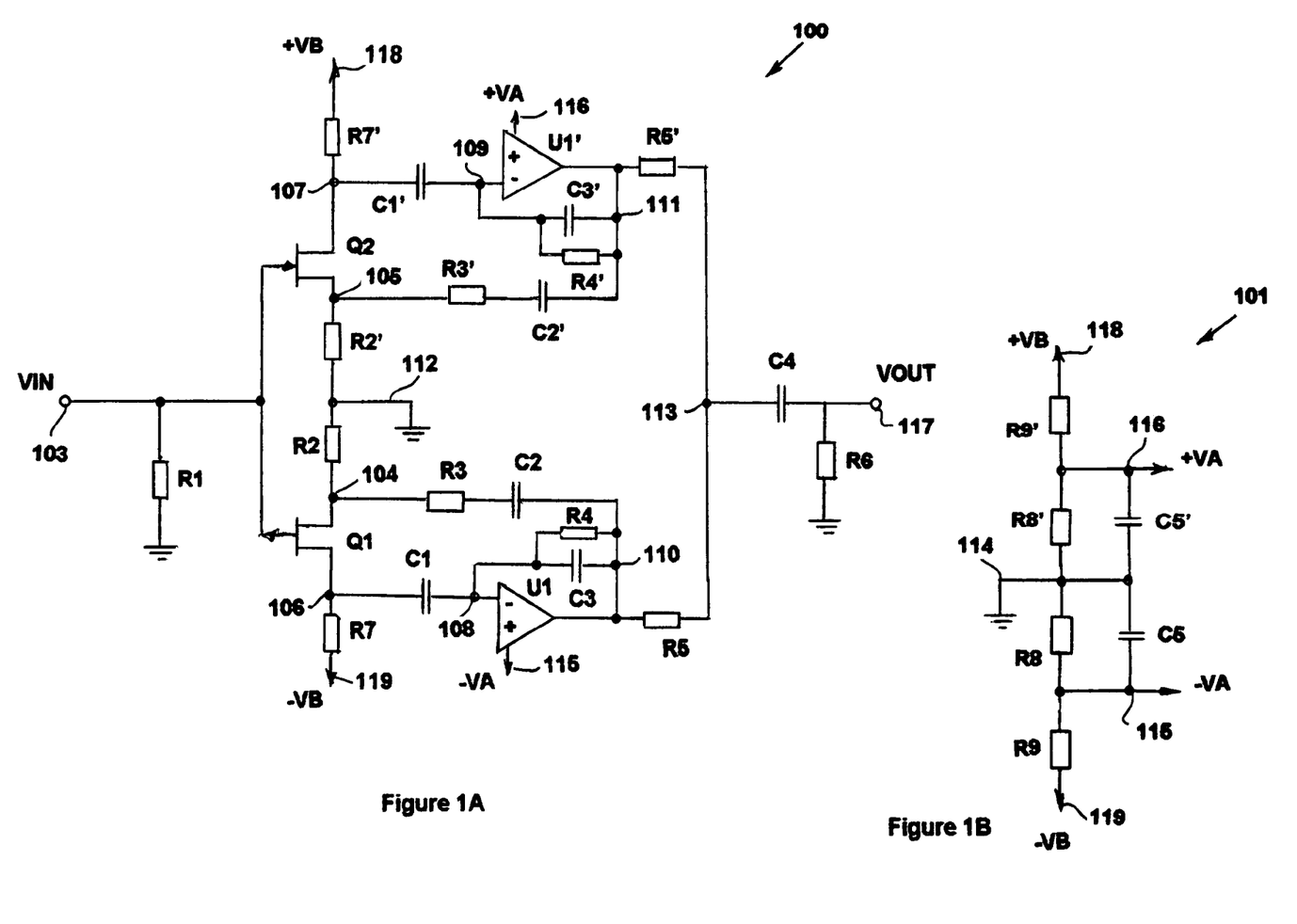
FIG. 1A A non-inverting amplifier according to the present invention.
FIG. 1B A bias power supply for an amplifier

FIGS. 1A and 1B show the preferred embodiment of the present invention wherein said amplifier is designated by the general reference number 100. FIG. 1B shows a mirrored power supply 101 and biasing network, both having a ground at node 114, a resistor R8 connected between said ground node 114 and node 115. A resistor R9 connects said node 115 and node 119. A negative voltage VA provided at node 115 and a negative supply voltage VB provided at node 119. A capacitor C5 connects said node 114 and node 115. In like manner, a resistor R8' connects said ground node 114 and node 116. A resistor R9' connects said node 116 and node 118. A positive voltage VB provided at node 118 and a positive voltage VA provided at node 116. A capacitor C5' connects said node 116 and node 118.

FIG. 1A shows said amplifier 100 utilizing said power supply 101 for positive and negative voltages, VA and VB. Said amplifier 100 includes an N-channel gain device, Q1, a P-channel gain device Q2, an input load resistor R1 connected between ground and an input node 103 providng an input signal voltage VIN and an output load resistor R6 between ground and node 117 providng an output signal voltage VOUT. The gates of Q1 and Q2 are connected to said input node 103 and their sources are connected respectively through resistors R2 and R2' to ground at node 112. The drains of Q1 and Q2 are connected respectively to nodes 106 and 107. Resistor R7 is connected between node 106 and node 119 and variable resistor R7' is connected between node 107 and node 118. A coupling capacitor C1 connects node 106 to the input of an inverting operational amplifier (op-amp) U1 at node 108 and another coupling capacitor C1' connects node 107 to the input of a second inverting op-amp U1' at node 109. The selection of the values of C1 and C1' allowing for a difference in DC voltages between the sources of said gain devices at 106 and 107 respectively and the input of said op-amps U1, U1'. A resistor R5 is connected between the output node 110 of op-amp U1 and a summing node, node 113, and a resistor R5' is connected between the output node 111 of op-amp U1' and node 113. A coupling capacitor C4 connects node 113 to an ouput node 117.

A local feedback loop from node 110 connects parallel reactive elements, a resistor R4 in parallel with a capacitor C3, to the input node 108 of said op-amp U1. In like manner a local feedback loop from node 111 connects parallel reactive elements, a resistor R4' in parallel with a capacitor C3', to the input node 109 of said op-amp U1'.

An overall feedback loop from node 110 connects serial reactive elements, a resistor R3 and a capacitor C2, to the source of gain device Q1 at node 104. In like manner an overall feedback loop from node 111 connects serial reactive elements, a resistor R3' and capacitor C2', to the source of gain device Q2 at node 105.

Preferably, said input gain devices are JFETs as they provide the ability to operate with very high input impedances. FETs and JFETs are preferrable to BJTs, as FETs and JFETs tolerate a wide dynamic range, that is, a wide variation in input signal voltage. FETs and JFETs are preferred as they are optimum matches for low capacitive sources such as condenser microphones, electret mikes and piezo-electric sensors.

Said positive voltages VA and VB of the power supply of FIG. 1B are connected respectively to nodes 116 and 118. Likewise, said negative voltages VA and VB of the power supply of FIG. 1B are connected respectively to nodes 115 and 119. Amplifer 100 utilizes feed forward distortion cancellation of distortions created by the nonlinear response of between the source capacitance and the voltage complimentary modulattion of the individual input device capacitance, not shown, to the amplitude of the input signal voltage. Said variable resistor R7' is used to adjust and match the operating conditions of the input device, thus varying and matching the complimentary input response to the voltage dependent capacitance of an input source. Alternately, resistor R5' could be used for this purpose. This matching results in an approximate 10 dB reduction by cancellation of distortion compared with that realized by amplifier 102. The absolute value of capacitance a signal produced by a capacitive input device, not shown, normally varies with the voltage to give a slightly nonlinear input signal. The mirrored amplifier 100 corrects this distortion in the input signal by generating two derivative input signals, each with an opposite polarity of distortion, but with their respective signals in phase and canceling the distortion by summing said signals at the output the output node 103 with a first order correction of this distortion. The feed forward distortion cancellation is based upon the excellent stability and predictability of the individual composite circuits.

Resistors R1", R2" and R" shown for amplifier 121 in FIG. 4 having the same respective functions as R1, R2 and R3 in said amplifier circuits 100, 102 and R1', R2' and R3' in amplifier circuit 102. Capacitor C2" having the same function as C2 and C2' in amplifier circuits 100 and 102. Certain desirable properties however are reduced when this is type of summing is done and include increases in overall noise and distortion characteristics.

Figure 2:
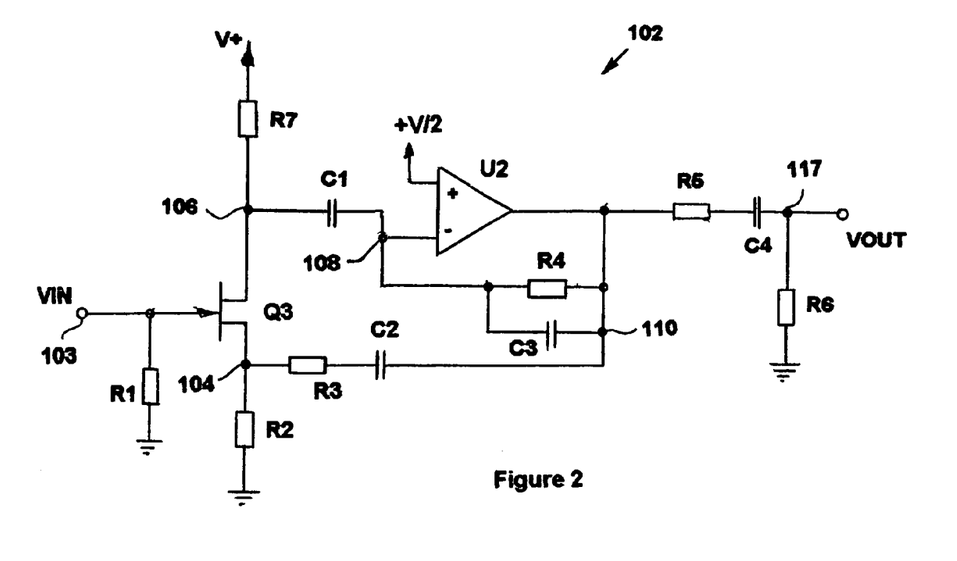
FIG. 2 A non-inverting amplifier according to the present invention.

In another embodiment of the present invention, FIG. 2 shows the simplest version of the present invention. An amplifier 102 comprised of an input device Q3 and an ouput gain device, an op-amp U2, with connections as described above for amplifier 100 for said input gain device Q2 and output gain device U1'. For amplifier 102, the voltage bias across R1 provides the input voltage to the gain of the JFET and R7 provides the bias voltage to the drain of said input gain device 03 as shown in FIG. 2.

The operation of this non-inverting amplifier 102 is as follows. The cascode connection at node 106 places the JFET Q3 in its most linear and widest bandwidth operating mode. The output gain op-amp U2 operates with an inverted input and is connected to the drain 106 of the input gain device Q3 through the coupling capacitor C1 allowing the output gain device U2 to operate in its most linear and stable mode. The local feedback loop for the op-amp U2 independently controls the local loop gain, thereby linearizing and stabilizing its own operation. The overall feedback is applied at node 104 at the source of the input gain device Q3 through resistor R3 and capacitor C2 controlling the overall gain and linearizing the response of the entire amplifier 102.

Figures 4A, 4B:
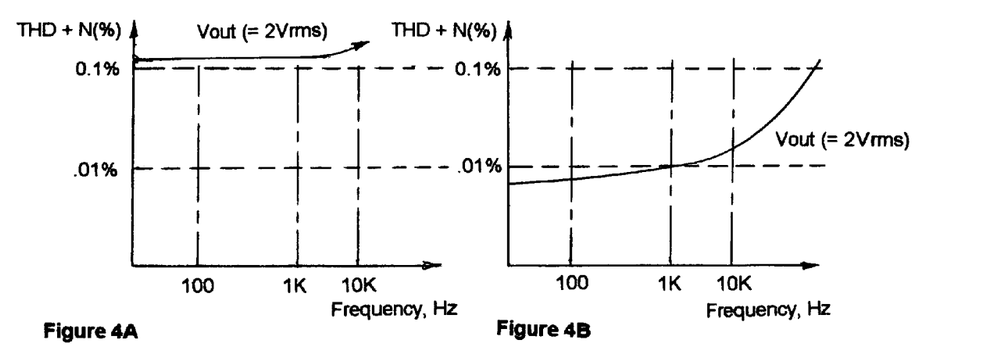
FIG. 4A A response diagram showing the distortion characteristics of a FET gain device.
FIG. 4B A response diagram showing the distortion characteristics of an op-amp.
Figure 4C:
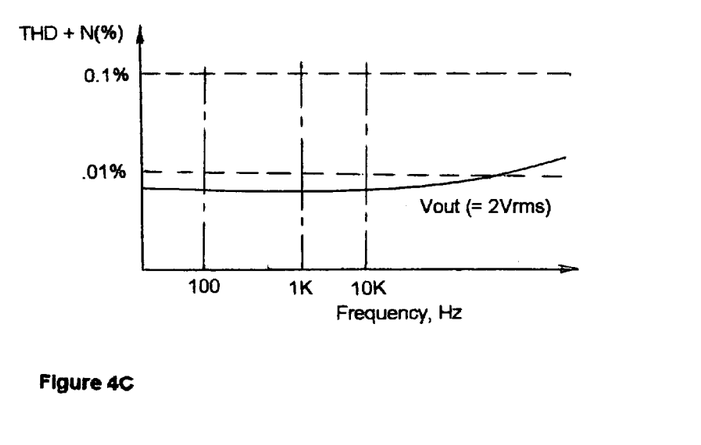
FIG. 4C A response diagram showing the distortion characteristics of the composite cascode amplifier.

As shown in FIG. 4A, the distortion profile of the input gain device Q1 is fairly level and as shown in FIG. 4B that of the op-amp U1 increases with frequency. The combination however, as shown in FIG. 4C, is clearly superior to that of either JFET Q1 or op-amp U1 independently because the overall feedback point 104 is connected to the source of the input device Q1, as shown in FIG. 2, resulting in distortion characteristics that are dominated by the input device, not shown.

Figure 3:
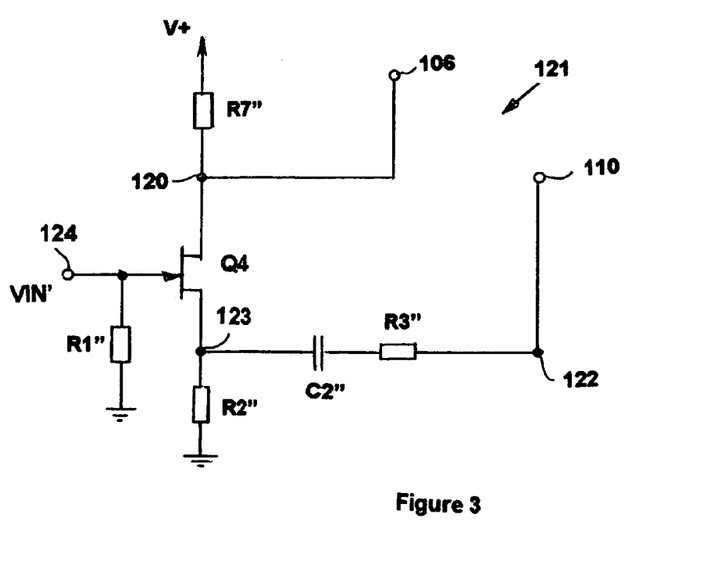
FIG. 3 A non-inverting summing amplifier according to the present invention.

Another advantage realized by using said amplifier 102, in a further embodiment of the present invention, is that one or more additional input signals VIN' can be summed without producing an inverted output signal, as is shown in FIG. 3. Each of said additional input signals VIN' is processed independently with a separate input gain device Q4 at a separate input node 124 connected to the gate of said input gain device Q4. The drain 120 of each of said separate input gain devices Q4 connect to the cascode node 106 of amplifier 102 thereby summing all input signals VIN, VIN' at the input node 108 of the inverting output gain device U2. The overall feedback from node 110 stabilizes the input gain device Q4 through a resistor R3" in series with a capacitor C2" to the source node 122 of said input gain device Q4. The circuit shown in FIG. 3 being typical of each additional input circuit. Multiple input signals can be attached to the amplifier 102 in this manner, thus minimizing the current drawn by the amplifier. This summing amplifier is unique in that it provides a non-inverting output without utilizing an additional inverting stage.

The input gain devices Q1, Q2, Q3 can be BJT devices but are preferrably JFETs. The advantage of using a JFET is the ablity to operate with very high input resistances (greater than 100 meg ohms) and that no input biasing network along with an input coupling capacitor are needed. This is important for maximum linearity for high impedance sources such as a capacitive sensor.

Normally, in existing amplifer circuits, the input gain device would be a single stage by itself. The present invention however integrates the use of a JFET Q1, Q2, Q3 as an input device together with an output op-amp to produce a single stage amplifier 100, 102, 121 which is stabilized and linearized by two feedback loops, a local one for the output op-amp U1 or U2 and an overall one for the input gain device Q1, Q2, Q3.

More specificly, the present invention (1) has a non-inverting amplifier topology, (2) the input device is a field effect transistor (JFET) or a bipolar junction transistor (BJT) operating in a common source or emitter configuration which is cascoded by the inverting input of an operational amplifier (opamp), (3) The cascode connection places the JFET or BJT in its most linear and widest bandwidth operating mode, (4) the opamp operates as an inverting amplifier and is connected to the drain or collector while the inverting opamp is operating in its most linear and stable mode, (5) the circuit has local nested feedback comprised of local inverted feedback from an operational amplifier and overall feedback to the source or emitter of an input device. The input device can be a voltage or current monitoring device such as a JFET or BJT respectively. The input device and the op-amp, as a unit, comprise a single stable stage which derives its effectiveness from this double nested feedback design. In particular, the overall feedback from the op-amp is applied to the source or emitter of the input device to control the overall circuit gain of the circuit thereby independently controlling the local loop gain and linearizing its own overall operation. Either an N-channel or P-channel JFET can be used or an NPN BJT or PNP BJT can be used for the input device. The DC operating point of the opamp is controlled independently via the reference voltage connected to the inverting input to the op-amp and thus no signal current is injected into the reference point.

If the input device is cascoded to the same potential as the DC operating point of the opamp, node 106, the drain or collector can be DC coupled to the inverting op-amp, otherwise a coupling capacitor is inserted into the path and the circuit will operate as an AC cascode and the bias of the input device and the opamp will be independent.

The overall noise performance of an operational amplifier varies tremendously and depends on many factors including supply current, cost, bandwidth, design and construction. As a consequence, the noise found in existing op-amp circuits for battery powered operation varies greatly. JFETs are available for low noise applications and can operate with high input impedance and minimal bias currents. Low powered and micro-powered op-amps tend to be three to four times nosier than comparable op-amps. By optimizing each circuit, overall noise levels can be lowered.

Figure 5:
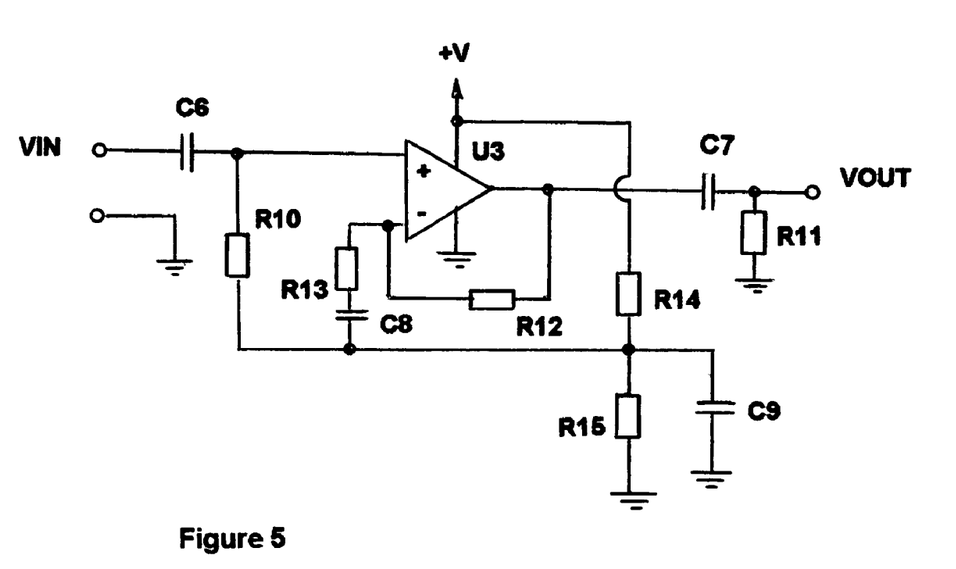
FIG. 5 A circuit showing a typical op-amp.

FIG. 5 shows a typical op-amp circuit which produces an inverted output signal.

The components required for the proper implementation of the present invention are routinely available and are low in cost.

Thus improved means for constructing three types of low power, low noise, low distortion and low cost amplifiers has been shown. All of the above are only some of the examples of available embodiments of the present invention. Accordingly, the above disclosure is not intended as limiting and the appended claims are to be interpreted as encompassing the entire scope of the invention.

REFERENCE NUMERALS—DESCRIPTION

| Numeral | Description |
| --- | --- |
| 100 | General reference number for amplifier |
| 101 | General reference number for voltage supply |
| 102 | General reference number for amplifier |
| 103, 124 | Input node |
| 104, 105 | Nodes |
| 106–109 | Virtual ground nodes |
| 110–116 | Nodes |
| 117 | Output node |
| 118 | Input node |
| 119, 120 | Nodes |
| 121 | General reference number for amplifier |
| 122, 123 | Feedback node |
| R1–R9 | Resistors |
| R1'–R6' | Resistors |
| R7' | Variable resistor |
| R8', R9' | Resistor |
| R1"–R3", R7" | Resistors |
| C1–C5, C1'–C5' | Capacitors |
| C2" | Capacitor |
| U1, U1', U2 | Operational amplifiers |
| Q1 | FET or BJT |
| Q2 | FET or BJT |
| Q3, Q4 | FET or JFET |

-continued

| Numeral | Description |
| --- | --- |
| U3 | Operational amplifier |
| R10–R16 | Resistors |
| C6–C9 | Capacitors |

What is claimed is:

1. An amplifier for amplifying an input signal comprising:
a signal input node for receiving said input signal,
a signal output node,
an input gain device having a control pin coupled to said signal input node, and further having a first and second terminal for current flow therebetween and said first terminal comprising a drain and said second terminal comprising a source,
an output gain device having an output terminal coupled to said signal output node,
a voltage biasing resistor connected to said first terminal and said first terminal connected to the inverting input of said output gain device,
a local feedback path coupled only between said output terminal and said inverting input of said output gain device and including a resistor in said local feedback path,
an overall feedback path coupled only between said output terminal of said output gain device and said second terminal of said input gain device and including a resistor in said overall feedback path,
current flow from said output gain device in said local feedback path linearizing local loop gain of said output gain device,
current flow from said input gain device in said overall feedback path linearizing overall loop gain of said input gain device and of said amplifier,
whereby a non-inverted output signal is produced at said signal output node proportional to said input signal voltage.

2. An amplifier as in claim 1 wherein the first terminal of said first gain device is connected to the inverting input of said output gain device with a dc-blocking coupling capacitor.

3. An amplifier as in claim 1 wherein said local feedback path includes a capacitor in parallel with said resistor and/or said overall feedback path includes a dc-blocking capacitor in series with said resistor.

4. An amplifier as in claim 1 wherein the output terminal of said output gain device is coupled by a series-coupled resistor connected in series with a dc-blocking capacitor to said signal output node.

5. An amplifier as in claim 1 wherein a ground-biasing resistor is connected from said signal output node to ground.

6. An amplifier as in claim 1 wherein said input gain device is a FET or JFET.

7. A summing amplifier for amplifying a first input signal and at least one additional input signal comprising:
a first signal input node for receiving said first input signal,
a signal output node,
a first input gain device having a control pin coupled to said first signal input node and further having a first local terminal and second local terminal for current flow therebetween, said first local terminal comprising a drain and said second local terminal comprising a source, an output gain device having an output terminal coupled to said signal output node,
a voltage biasing resistor connected to said first local terminal and said first local terminal connected to the inverting input of said output gain device,
a local feedback path coupled only between said output terminal and said inverting input of said output gain device and including a resistor in said local feedback path,
a first overall feedback path coupled between said output terminal and said second terminal of said first input gain device and including a resistor in said first overall feedback path,
at least one additional signal processing means comprised of;
a remote signal input node for receiving one of said at least one additional input signals,
a remote input gain device having a control pin coupled to said remote signal input node, and further having a first remote terminal and second remote terminal for current flow therebetween and said first remote terminal comprising a drain and said second remote terminal comprising a source,
a voltage biasing resistor connected to said first remote terminal and said first remote terminal connected to said first local terminal,
an additional overall feedback path from said output terminal of said output gain device to said second remote terminal of said remote input gain device and including a resistor in said additional overall feedback path,
current flows from said first local input device and from said remote input device summed at said first local terminal,
current flow from said output gain device in said local feedback path linearizing local loop gain of said output gain device,
current flow from said output gain device in said first overall feedback path linearizing overall loop gain of said first input gain device, and
current flow from said output gain device in said remote overall feedback path linearizing overall loop gain of said remote input gain device,
whereby said summing amplifier is linearized, and
whereby a non-inverted output signal is produced at said signal output node proportional to the sum of said first input signal voltage and to all of at least one additional input signal voltages.

8. An amplifier as in claim 7 wherein the first terminal of said first input gain device is connected to the inverting input of said output gain device with a dc-blocking coupling capacitor.

9. An amplifier as in claim 7 wherein said local feedback path includes a capacitor in parallel with said resistor.

10. An amplifier as in claim 7 wherein the output terminal of said output gain device is coupled by a series-coupled resistor connected in series with a dc-blocking capacitor to said signal output node.

11. An amplifier as in claim 7 wherein a ground-biasing resistor is connected from said signal output node to ground.

12. An amplifier as in claim 7 wherein said local and/or each or any remote overall feedback paths include a dc-blocking capacitor in series with the resistor in a feedback path.

13. An amplifier as in claim 7 wherein the output terminal of said output gain device is coupled by a series-coupled resistor connected in series with a dc-blocking capacitor to said signal output node.

14. An amplifier as in claim 7 wherein a ground-biasing resistor is connected from said signal output node to ground.

15. An amplifier as in claim 7 wherein said input gain device is a FET or JFET.

16. An input-distortion-reducing amplifier for amplifying an input signal comprising:
a signal input node for receiving said input signal,
a signal output node,
a first input gain device having a control pin coupled to said signal input node, and further having a first and second terminal for current flow therebetween and said first terminal comprising a drain and said second terminal comprising a source,
a first output gain device having an output terminal coupled through a first coupling resistor to an output summing node,
said output summing node connected to said signal output node,
a first voltage biasing resistor connected to said first terminal of said first input gain device,
a second voltage biasing resistor connected to said second terminal of said first input gain device,
said first terminal of said first input gain device connected to the inverting input of said first output gain device,
a first local feedback path coupled between said output terminal of said first output gain device and said inverting input of said first output gain device and including a resistor in said first local feedback path,
a first overall feedback path coupled between said output terminal of said first output gain device and said second terminal of said first input gain device and including a resistor in said first overall feedback path,
a second input gain device having a control pin coupled to said signal input node, and further having a first and second terminal for current flow therebetween and said first terminal comprising a drain and said second terminal comprising a source,
a second output gain device having an output terminal coupled through a second coupling resistor to said output summing node,
a second voltage biasing resistor connected to said second terminal of said second input gain device,
a second voltage biasing resistor connected to said first terminal of said second input gain device,
said first terminal of said second input gain device connected to the inverting input of said second output gain device,
a second local feedback path coupled between said output terminal of said second output gain device and said inverted input of said second output gain device and including a resistor in said second local feedback path,
a second overall feedback path coupled between said output terminal of said second output gain device and said second terminal of said second input gain device and including a resistor in said second overall feedback path,
said first input gain device comprised of an N-channel FET or JFET,
said second input gain device comprised of a P-channel FET or JFET,
current flow from said first output gain device in said first local feedback path linearizing local loop gain of said first output gain device, current flow from said first output gain device in said first overall feedback path linearizing overall loop gain of said first input gain device, current flow from said first output gain device through a load resistor to a summing point, current flow from said second output gain device in said second local feedback path linearizing local loop gain of said second output gain device, current flow from said second input gain device in said second overall feedback path linearizing overall loop gain of said second input gain device, current flow from said second output gain device through a load resistor to a summing point, said current flows from said first and from said second output gain devices summing at said summing node being respectively of equal amplitude, but opposite in phase, said current flows being adjusted to equal magnitudes by current adjusting means, thereby canceling distortion arising from nonlinear capacitive input signal response, current flow from said summing point to said signal output node, whereby a non-inverted output signal with reduced distortion is produced by said amplifier at said signal output node proportional to said input signal voltage.

17. An amplifier as in claim 16 wherein the first terminal of said first gain device is connected to the inverting input of said first output gain device with a dc-blocking coupling capacitor and/or the first terminal of said second gain device is connected to the inverted input of said second output gain device with a dc-blocking coupling capacitor.

18. An amplifier as in claim 16 wherein said first local feedback path includes a capacitor in parallel with said resistor and/or said second local feedback path includes a capacitor in parallel with said resistor.

19. An amplifier as in claim 16 wherein said first overall feedback path includes a dc-blocking capacitor in series with said resistor and/or said second overall feedback path includes a dc-blocking capacitor in series with said resistor.

20. An amplifier as in claim 16 wherein said summing node is coupled with a dc-blocking capacitor to said signal output node.

21. An amplifier as in claim 16 wherein a ground-biasing resistor is connected from said signal output node to ground.

22. An amplifier as in claim 16 wherein said current flow of equal amplitude from said first and from said second output gain devices to said summing node is realized by adjusting the resistive value of at least one of said resistors in said two local feedback paths and/or of at least one of said resistors in said two overall feedback paths and/or of at least one of said voltage biasing resistors connected to said drains of said two input gain devices and/or of at least one of said voltage biasing resistors connected to said sources of said sources of said two input gain devices and/or of at least one of said two load resistors.

23. A method of operating an amplifier comprising the steps of:

sensing an input signal voltage at the gate of an input gain device, generating a biasing voltage at the drain node of said input gain device, generating a biasing voltage at the source node of said input gain device, directing a portion of a first current from said drain node through said inut gain device from said drain node to said source node in proportion to said input signal voltage, directing a second portion of said first current from said drain node to the inverting input of an output gain device, sensing said second portion of said first current at said output gain device and generating a second current flow from said second gain device to an output node, directing a first portion of said second current flow through a resistor to a final output signal node, directing a second portion of said second current flow, as feedback current, through a resistor to said input node of said inverting output gain device, directing a third portion of said second current, as feedback current, through a resistor to the source node of said first gain device, said output gain device sensing said second portion of said second current thereby proportionally reducing said second current flow through said output gain device, said input gain device sensing said third portion of said second current thereby proportionally reducing said first current flow through said input gain device, producing a non-inverted output signal at said final signal output node proportional to said input signal voltage.

24. A method as in claim 23 wherein said step of directing a second portion of said first current includes blocking dc current flow, with a capacitor in series, from said drain to said inverting input of said output gain device.

25. A method as in claim 23 wherein said step of directing a second portion of said second current, as feedback current, includes a capacitor in parallel with said resistor.

26. A method as in claim 23 wherein said step of directing a third portion of said second current, as feedback current, includes blocking dc current flow, with a capacitor in series with said resistor, from said output gain device to said source of said input gain device.

27. A method as in claim 23 wherein said first gain device is a FET or JFET.

28. A method of operating a summing amplifier comprising the steps of:

sensing a separate input signal voltage at each gate of at least two separate input gain devices, generating a separate biasing voltage at the drain node of each of said at least two input gain devices, generating a separate biasing voltage at the source node of each of said at least two input gain devices, for each of said at least two input gain devices, directing a portion of a first current from said drain node of each of at least two separate input gain devices respectively through each of said at least two input gain devices to their respective source nodes in proportion to their respective, separate input signal voltages, directing a second portion of said first current from said drain node of each of said at least two input gain devices to the inverting input of an output gain device as an average current signal of all of said second portions, sensing said average current signal at the input of said output gain device and generating a second current flow from said output gain device to an output node, directing a first portion of said second current flow from said output node through a load resistor to a final output signal node, directing a second portion of said second current flow, as feedback current, from said output node through a first feedback resistor to said input node of said output gain device, directing a third portion of said second current, in proportions and as feedback current, from said output node through separate feedback resistors to the source node of each of said at least two of said input gain devices, said output gain device sensing said second portion of said second current thereby proportionally reducing said second current flow through said output gain device, each of said at least one input gain devices sensing its respective fraction of said third portion of said second current thereby proportionally reducing its first current flow, whereby a non-inverted output signal is produced at said final signal output node proportional to the average of all of said at least two input signal voltages.

29. A method as in claim 28 wherein said step of directing said average current signal from said drains of said at least two input gain devices to said inverted input of said output gain device includes blocking dc current flow to said input, with a coupling capacitor.

30. A method as in claim 28 wherein said step of directing a second portion of said second current, as feedback current, includes a capacitor in parallel with said first feedback resistor.

31. A method as in claim 28 wherein said step of directing a third portion of said second current, proportionally and as feedback current, includes blocking dc current flow for each feedback path, with a capacitor in series with each of said second feedback resistors.

32. A method as in claim 28 wherein one or more of said at least two input gain devices are FETs or JFETs.

33. A method of operating an input-distortion-reducing amplifier comprising the steps of:

sensing an input signal voltage at the gate of a first input gain device, an N-Channel JFET or FET, generating a first biasing voltage across a first biasing resistor at the source node of said first input gain device, generating a second biasing voltage across a second biasing resistor at the drain node of said first input gain device, generating a first current through said first input gain device from its source node to its drain node in proportion to said input signal voltage, sensing said input signal voltage at the gate of a second input gain device, a P-Channel JFET or FET, generating a third biasing voltage across a third biasing resistor at the source node of said second input gain device, generating a fourth biasing voltage across a fourth biasing resistor at the drain node of said second input gain device, generating a second current through said second input gain device from its source node to its drain node in proportion to said input signal voltage, sensing said input signal voltage and said first biasing voltage at said source node of said first input gain device at the input node of an inverting first output gain device and generating a third current flow to a first output node, sensing said input signal voltage and said third biasing voltage at said source node of said second input gain device at the input node of an inverting second output gain device and generating a fourth current flow to a second output node, said first input gain device sensing said a third portion of said third current thereby proportionally reducing said first current flow through said first gain device, said second input gain device sensing said a third portion of said fourth current thereby proportionally reducing said second current flow through said second input gain device, said first portions of said third and fourth currents combining at said summing node, being adjusted to equal magnitudes by current adjusting means, creating a final output signal, said final output signal canceling common out-of-phase components generated by said amplifier from non-linear characteristics of said input signal, producing a non-inverted output signal with reduced distortion at said signal output node proportional to said input signal voltage.

34. A method as in claim 33 wherein said step of sensing said sensing said input signal voltage and said first biasing voltage at said source node of said first input gain device includes a dc blocking coupling capacitor between said source node and said input node of said first output gain device and of sensing said input signal voltage and said third biasing voltage at said source node of said second input gain device includes a dc blocking coupling capacitor between said source node and said input node of said second output gain device.

35. A method as in claim 33 wherein said step of directing a second portion of said third current, as a local feedback current, includes a capacitor in parallel with said first feedback resistor and of directing a second portion of said fourth current, as a local feedback current, includes a capacitor in parallel with said second feedback resistor.

36. A method as in claim 33 wherein said step of directing a third portion of said third current, as an overall feedback current, includes a blocking dc current capacitor in series with said third feedback resistor and of directing a third portion of said fourth current, as an overall feedback current, includes a blocking dc current capacitor in series with said fourth feedback resistor.

37. A method as in claim 33 wherein said step of equalizing the magnitudes of the first portion of said third and fourth currents is by adjusting one or more of the resistive value of at least one of said resistors in said two local feedback paths and/or of at least one of said resistors in said two overall feedback paths and/or of at least one of said voltage biasing resistors connected to said drains of said two input gain devices and/or of at least one of said voltage biasing resistors connected to said sources of said sources of said two input gain devices and/or of at least one of said two load resistors.

* * * * *